United States Patent [19]
Byrne et al.

[11] Patent Number: 5,852,375
[45] Date of Patent: Dec. 22, 1998

[54] 5V TOLERANT I/O CIRCUIT

[75] Inventors: Timothy Gerard Byrne; Brian T. Morley, both of Dublin, Ireland

[73] Assignee: Silicon Systems Research Limited, Dublin, Ireland

[21] Appl. No.: 797,565

[22] Filed: Feb. 7, 1997

[51] Int. Cl.[6] ............................ H03K 3/00; H02H 3/20
[52] U.S. Cl. ................................... 327/108; 361/56
[58] Field of Search ........................ 327/108, 112, 327/333, 374, 376, 377, 427, 434, 437; 326/17, 63, 68, 80–83, 102; 307/112, 125, 130, 139; 361/56, 111

[56] References Cited

U.S. PATENT DOCUMENTS

| | | | |
|---|---|---|---|
| 4,983,860 | 1/1991 | Yim et al. ........................ | 326/17 |
| 5,300,835 | 4/1994 | Assar et al. ...................... | 326/68 |
| 5,528,447 | 6/1996 | McManus et al. ................ | 361/91 |
| 5,617,283 | 4/1997 | Krakauer et al. ................ | 361/56 |
| 5,712,586 | 1/1998 | Kitao ............................... | 327/333 |

Primary Examiner—My-Trang Nu Ton
Attorney, Agent, or Firm—Richard K. Robinson, Attorney at Law

[57] ABSTRACT

An integrated circuit has an I/O circuit that is connected to an I/O PAD. The I/O PAD may have greater voltage than the VDD associated with the integrated circuit so there is provided a switching circuit that is connected between the VDD and the I/O PAD. An output circuit is also provided that comprises n-channel transistors connected between the PAD and the ground. There is a cascode arrangement of p-channel transistors connected between the I/O PAD and VDD.

6 Claims, 6 Drawing Sheets

# 5V TOLERANT I/O CIRCUIT

BACKGROUND OF INVENTION

This invention relates to input/output (I/O) circuit of an integrated circuit that is tolerant of 5 volts being connected to its I/O PAD. More particularly, this invention relates to I/O circuit for integrated circuits that are tolerant of 5 volts being connected to its I/O PAD even when there is no power applied to the integrated circuit.

The I/O circuit for integrated circuits are typically connected to a system's bus which may have a voltage level present even when the integrated circuit itself is not enabled or powered up. Under these conditions, it is important that the VDD of the integrated circuit should remain at ground level and not have a voltage potential on it by the presence of a 5 volt signal on the I/O PAD.

The challenge presented to a designer of I/O circuits is increased by the design rules associated with 0.35 micron processes or less. These transistors can only withstand a maximum of 4 volts across the gate oxide or 4 volts dropped from drain and to source.

The prior art method of designing I/O circuits to provide 5 volt tolerance are only effective when the integrated circuit's VDD supply is raised to approximately 3.3 volts. An example of the prior art output buffers is shown in FIG. 1 to which reference should now be made.

The output buffer consists of two n-channel transistors. Transistor 1 and transistor 3 are connected in a cascode arrangement 9 between the output PAD 7 and the ground 5. Transistor 3 has its drain 11 connected to the PAD 5 and uses VDD as a gate voltages as illustrated by connection 13 ensuring that the voltage on the PAD 7 is divided between the transistors 1 and 3. A p-channel output buffer 21 includes transistors 15, 17 and 19. Transistors 17 and 19 switch the bulk of 15 to the higher of VDD or the PAD voltage. The gate of 15, when 15 is off, is switched under the control of the gate drive circuit 23 via conductor 25 to the higher voltage of VDD or the voltage on PAD 7.

In the embodiment of FIG. 1, when VDD is zero such as when the integrated circuit to which the input/output circuit 100 is associated is not turned on and there is 5 volts on the PAD 7 then the voltage drop across transistors 15, 17 and 19 will exceeds 4 volts. This results in damage to each of the transistors. Similarly, the n-channel transistor 3 will have 5 volts from the drain 11 to the gate or conductor 13 damaging the gate oxide.

SUMMARY OF THE INVENTION

An integrated circuit has an I/O circuit that is connected to an I/O PAD. The I/O PAD may have greater voltage than the VDD associated with the integrated circuit so there is provided a switching circuit that is connected between the VDD and the I/O PAD. An output circuit is also provided that comprises n-channel transistors connected between the PAD and the ground. There is a cascode arrangement of p-channel transistors connected between the I/O PAD and VDD.

The cascode arrangement performs the function of a potential divider for producing intermediate voltages. The intermediate voltages are used to control the gates above the cascoded n-channel and p-channel transistors. The use of the intermediate voltages protects all transistors from breakdown.

DETAILED DESCRIPTION OF THE EMBODIMENT

Figure 1:
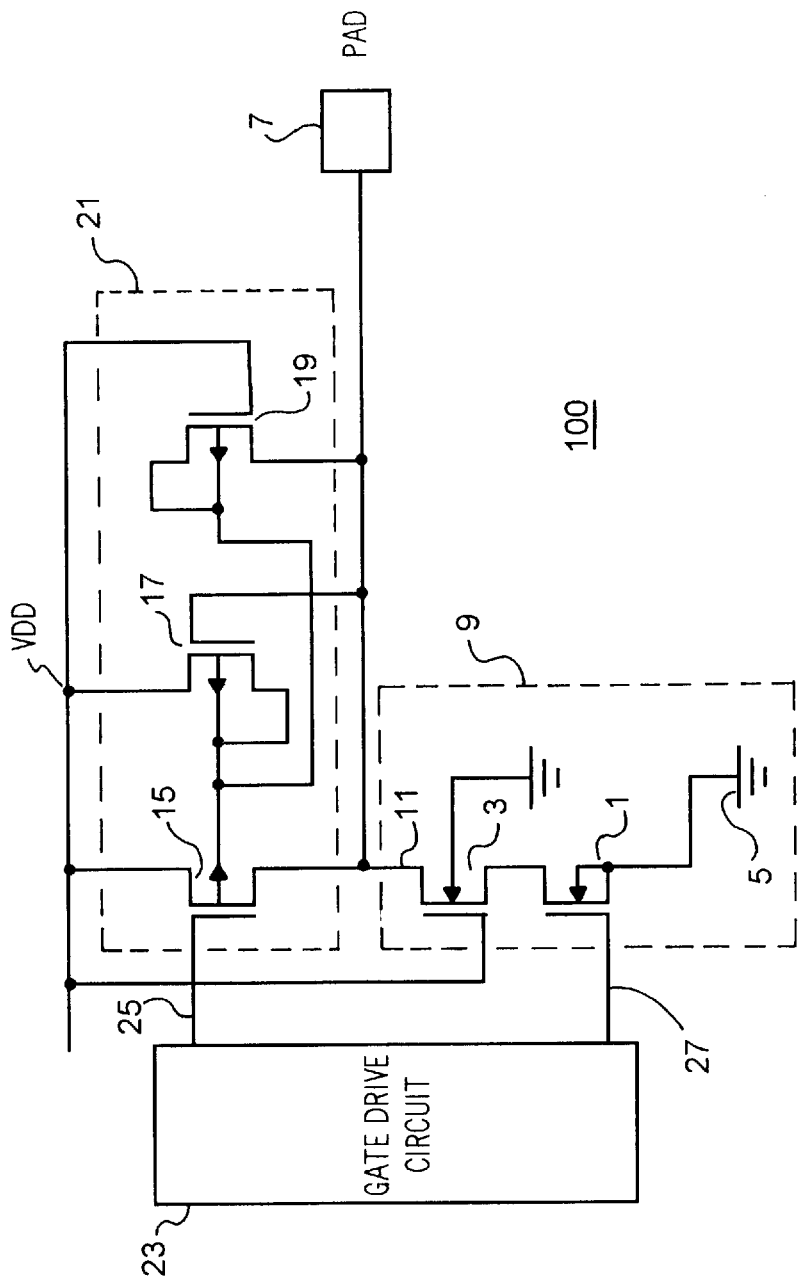
FIG. 1 is a simplified schematic diagram of a prior art 5 volt tolerant I/O circuit.
Figure 2:
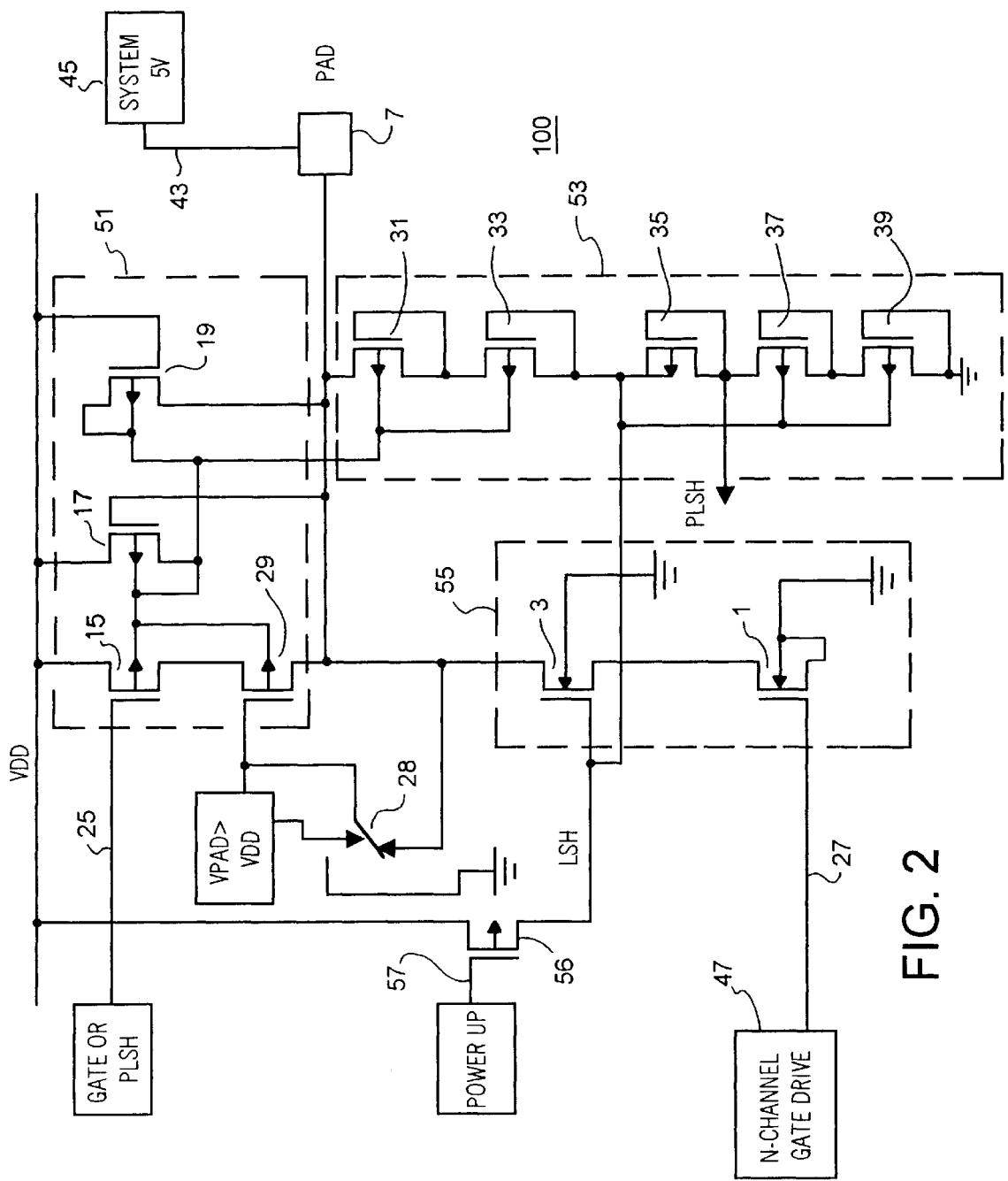
FIG. 2 is a simplified schematic diagram of an I/O circuit according to the invention.

FIG. 2, to which reference should now be made, there is shown a simplified schematic diagram of an output section 100 of an I/O circuit according to the invention. The output section includes a p-channel circuit 51; an n-channel circuit 55; and a potential divider circuit 53. The p-channel circuit 51 has a transistor 19 with its gate connected to VDD and its source connected to the PAD 7. The drain of transistor 19 is connected to its n-well and also is connected to the drain and n-well of transistor 17 as well as the n-well of transistors 15 and 29. Transistor 17 source is connected to VDD with the gate connected to the PAD 7. Transistor 15 source is connected to VDD, the gate is connected to a switch that is used when the voltage on PAD 7 is less than VDD. Transistor 29 is a transistor that is enabled and switched on when the voltage on the PAD 7 is less than VDD. Gate of transistor 29 is connected to the PAD voltage (VPAD) by the action of switch 28 to switch off transistor 29, when VPAD exceeds VDD.

The n-channel circuit 55 includes transistors 1 and 3 that are arranged in cascode arrangement. The drain of transistor 3 is connected to the PAD 7 and the source is connected the drain of transistor 1. The source of transistor 1 is connected to ground as it is the p-well of both transistors 1 and 3. The n-channel gate drive 47 provides a gate signal via conductor 27 to transistor 1. Additionally, transistor 3 gate is connected to VDD when VDD is powered up or to an intermediate voltage when the voltage on pin 7 (VPAD) is greater than VDD. Transistor 56 connects VDD to the gate of transistor 3 when VDD is not equal to zero voltage.

The potential divider 53 is a cascode arrangement of transistors 31, 33, 3 5, 37 and 39 that is connected between PAD 7 and around. The drains and gates of each transistor are connected together. The n-wells of transistors 31 and 33 are connected to the n-wells of the p-channel output buffer. Additionally, the drain of transistor 33 and the source of transistor 35 provides an intermediate voltage LSH to the gate of transistor 3 as well as the drive potential to the n-wells of transistor 35, 37 and 39. LSH controls the gate of transistor 3 when VDD is equal to zero and there is a voltage present on PAD 7 (power up). A second intermediate voltage is provided at the junction of the drain of transistor 35 and the source of transistor 37 denoted at PLSH. PLSH is used to control transistor 15 when the voltage on PAD 7 (VPAD) is greater than VDD.

The cascode of two p-channel transistors 29 and 15 between VPAD and VDD withstands the applied voltage differential VPAD minus VDD. In this cascode, the p-channel transistor 29 is connected to VPAD is turned off when VPAD is greater than VDD by driving its gate to VPAD. This prevents current flow from VPAD to VDD. The gate of the second p-channel transistor 15 is connected between the p-channel transistor 29 and VDD is driven to an intermediate voltage such that the p-channel transistor 29 and the p-channel transistor 15 divide up the voltage VPAD minus VDD between them. The intermediate voltage is provided by a tap between transistors 35 and 37.

The PAD 7 is connected to a system 45 that contains, in the case of this embodiment, 5 volts. The system 45 is connected to PAD 7 via conductor 43.

Although the invention has been described with VDD at approximately 3.3 volts and a maximum voltage on the PAD is 5 volts, it is well known that the semiconductor industry is trying to establish standardized voltages. In fact, in the future, this may happen but regardless there will always be mixed signals on buses such as at 43 and this invention will work equally well where the voltage provided by the system 45 is 3.5 and VDD is at 2.5 volts. This embodiment can still be used to protect the transistors and circuits with minor modification to the potential divider 53.

Figure 3:
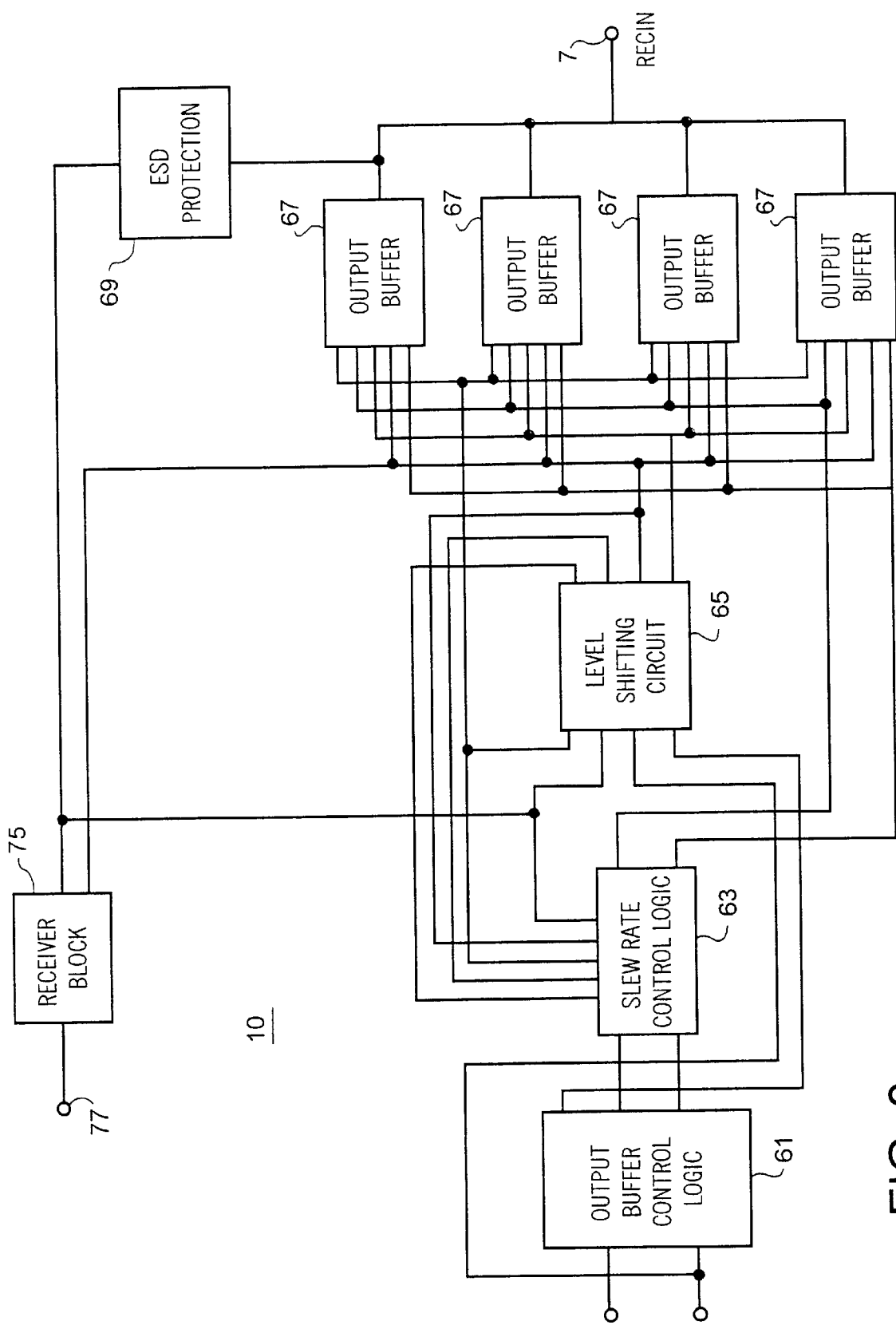
FIG. 3 is a block diagram of an I/O circuit according to the invention.

In FIG. 3, to which reference should now be made, there is shown a block diagram of an input/output circuit 10 that includes an output buffer controller 61. The output buffer controller 61 drives a slew rate control logic 63 and a level shifting circuit 65. The output of the level shifting circuit 65 is fed back to the slew rate control logic 63 and also to a plurality of output buffers 67. Each output buffer 67 is connected to the PAD 7.

The PAD 7 is both an input and output PAD . Consequently, there is an ESD protection circuit 69 provided. The output of the ESD protection circuit is applied to a receiver 75 which transfers data via connection 77 to the remaining circuits contained within the integrated circuit in which the I/O circuit 10 is a portion of.

Figure 4:
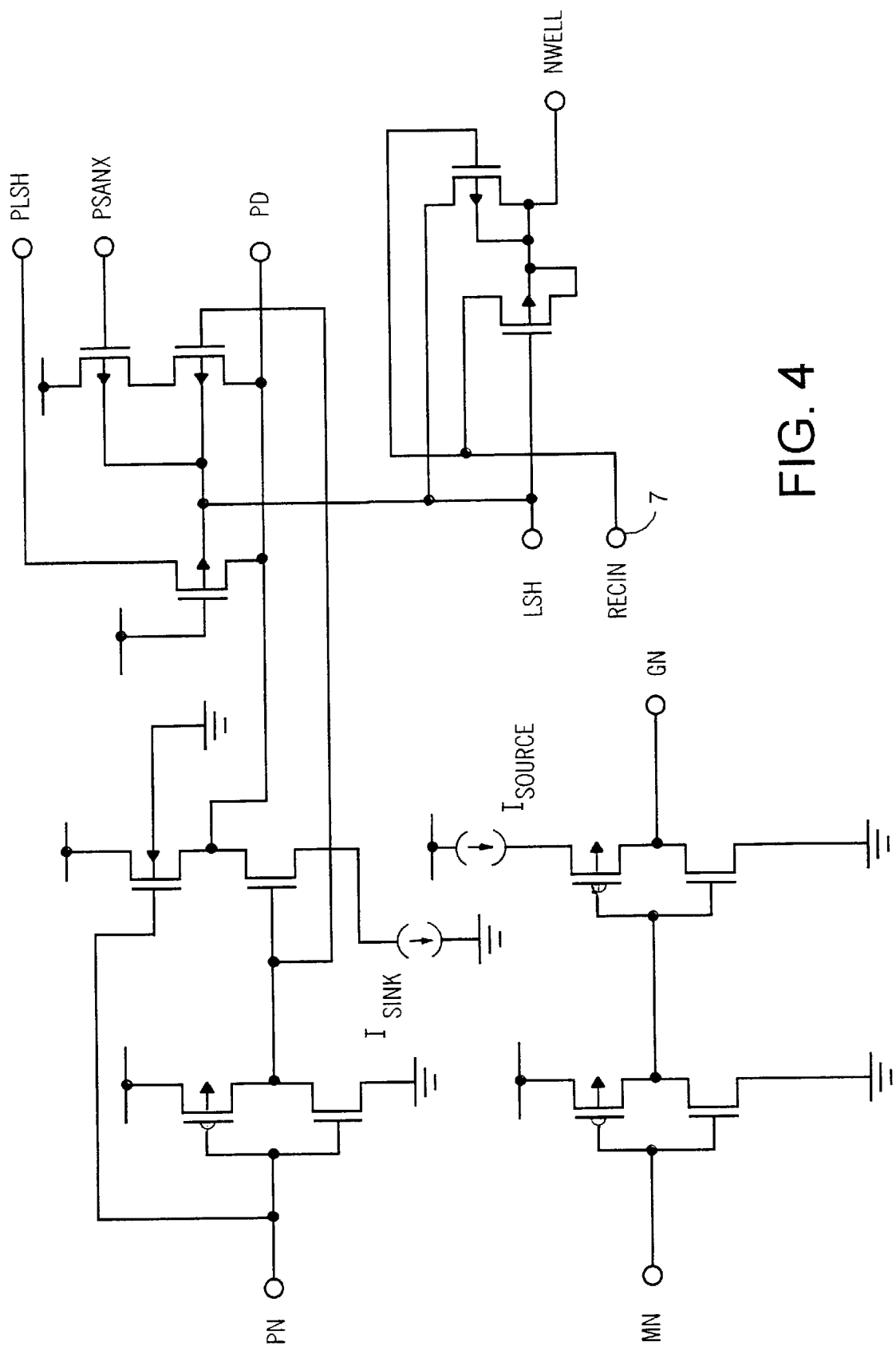
FIG. 4 is a schematic diagram of the slew rate control circuit of FIG. 3.
Figure 6:
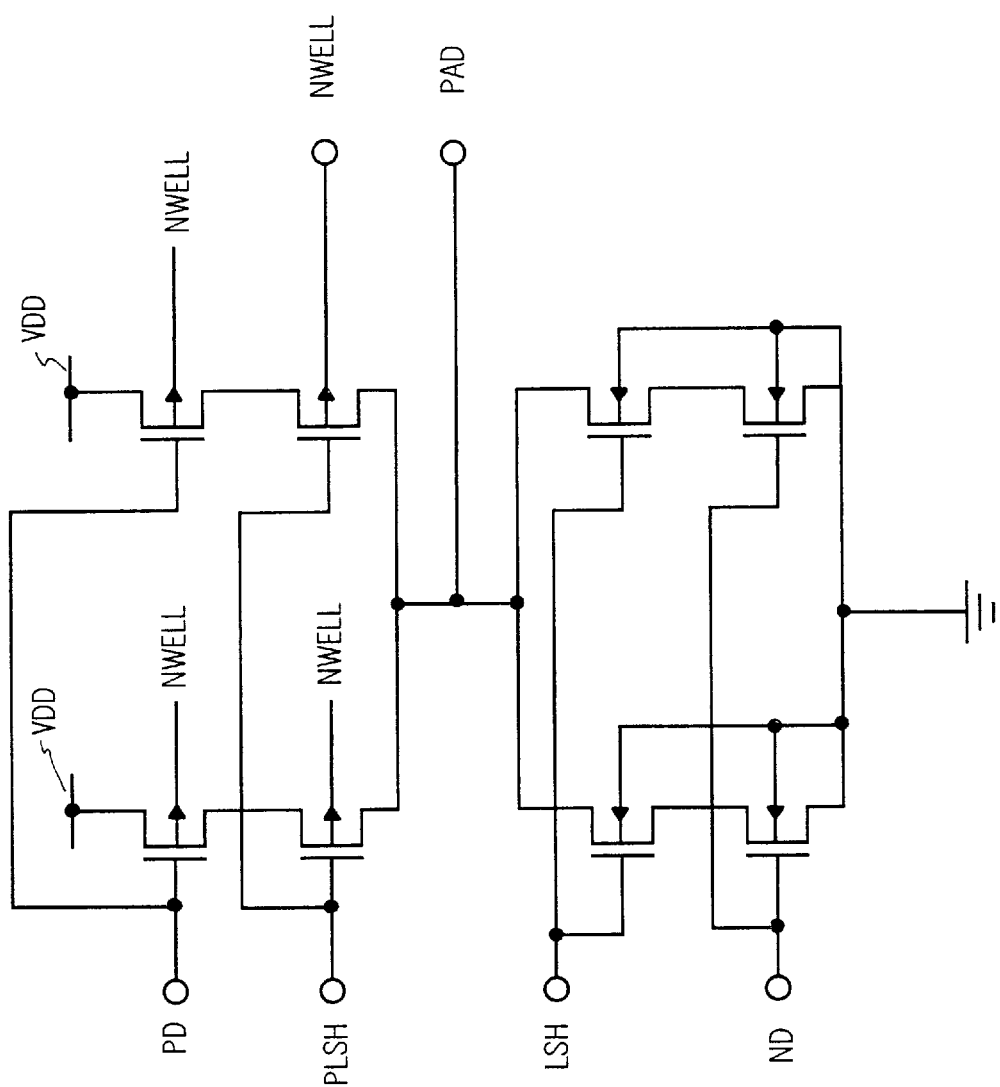

FIG. 4 is a diagram of the slew rate controller and it shows the generation of a PD signal which is connected to the output driver circuits of FIG. 6.

Figure 5:
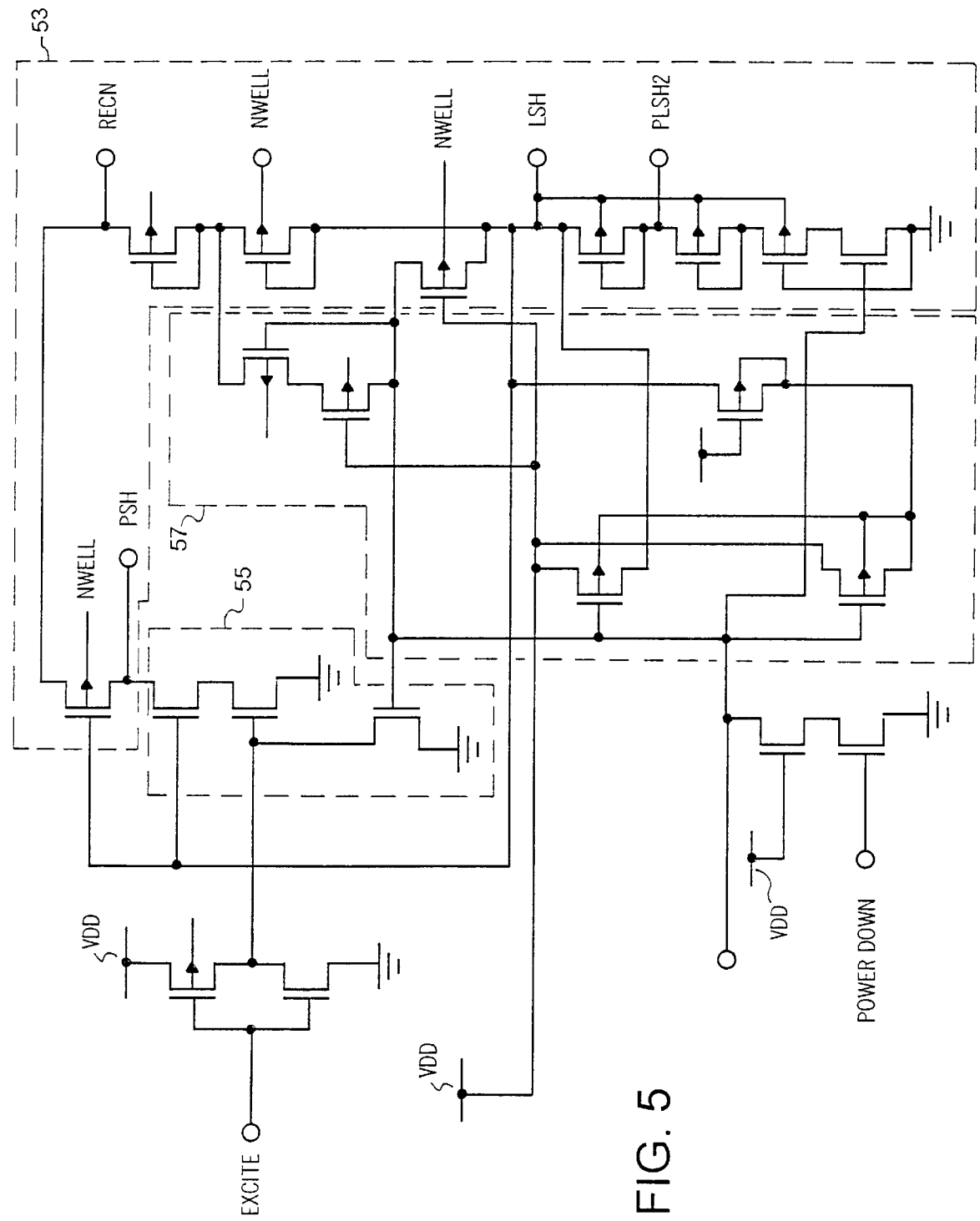
FIG. 5 is a schematic diagram of the level shift circuit of the embodiment of FIG. 3; and, FIG. 6 is a schematic diagram of the output drivers of the embodiment of FIG. 3.

FIG. 5 is a schematic diagram of a level shifting circuit 65 and illustrates the generation of the PLSH/LSH circuits as was discussed in connection with FIG. 2. A second signal PLSH 2 is generated in the embodiment of FIG. 5 which is used to drive the output drivers of FIG. 6 and is denoted as PD and is applied to the output drivers via the slew rate control circuit of FIG. 4.

The output drivers of FIG. 6 is the output stage and is the circuits that are known in the art.

We claim:

1. An I/O circuit comprising:

an I/O PAD connected to receive a first voltage;

a first circuit having at least one first type transistor connected between a second voltage and the I/O PAD and a second circuit having at least one second type transistor connected between the I/O PAD and a third voltage; and a cascode arrangement of at least first and second transistors of the first type of transistors between the I/O PAD and the third voltage and a junction between a source of the first transistor and a drain of the second transistor being connected to a gate of the at least one second type of transistor.

2. The I/O circuit according to claim 1 further comprising:

a third transistor connected in series between the at least one second type transistor and the third voltage and, a gate control circuit operatively connected to a gate of the third transistor.

3. The I/O circuit according to claim 1 wherein each transistor of the cascode arrangement includes a drain and a gate with the gate being connected to the drain.

4. The I/O circuit according to claim 3 wherein the cascode arrangement is a potential divider and the location of the junction of the first and second transistors being a first tap and selected to divide the first voltage to an intermediate voltage approximately equal to the second voltage.

5. The I/O circuit according to claim 4 wherein the intermediate voltage is applied to the gate of the at least one second type transistor.

6. The I/O circuit according to claim 5 wherein the potential divider further includes at least a third transistor of the first type between a drain of the first transistor and the third voltage and a junction between the drain of the first transistor and a source of the third transistor being connected to a gate of the at least one first type transistor.

\* \* \* \* \*